US009768099B1

(12) United States Patent
Cho et al.

(10) Patent No.: US 9,768,099 B1
(45) Date of Patent: Sep. 19, 2017

(54) IC PACKAGE WITH INTEGRATED INDUCTOR

(71) Applicant: Infineon Technologies Americas Corp., El Segundo, CA (US)

(72) Inventors: Eung San Cho, Torrance, CA (US); Parviz Parto, Laguna Niguel, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/148,248

(22) Filed: May 6, 2016

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3107* (2013.01); *H01L 23/49503* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/32245* (2013.01); *H01L 2224/48091* (2013.01); *H01L 2224/48108* (2013.01); *H01L 2224/48245* (2013.01); *H01L 2224/73265* (2013.01); *H01L 2224/8382* (2013.01); *H01L 2224/8384* (2013.01); *H01L 2224/83801* (2013.01); *H01L 2224/83851* (2013.01); *H01L 2224/92247* (2013.01); *H01L 2924/1032* (2013.01); *H01L 2924/1033* (2013.01); *H01L 2924/10253* (2013.01); *H01L 2924/1304* (2013.01); *H01L 2924/13064* (2013.01); *H01L 2924/13091* (2013.01); *H01L 2924/14* (2013.01); *H01L 2924/1425* (2013.01); *H01L 2924/1426* (2013.01); *H01L 2924/17724* (2013.01); *H01L 2924/17747* (2013.01); *H01L 2924/19042* (2013.01); *H01L 2924/19102* (2013.01)

(58) Field of Classification Search
None
See application file for complete search history.

(56) References Cited

U.S. PATENT DOCUMENTS 7,268,659 B2  9/2007 Nishio et al.
8,432,017 B2  4/2013 Kuo et al.
(Continued)

OTHER PUBLICATIONS

U.S. Appl. No. 15/161,077, filed by Eung San Cho, filed May 20, 2016.

(Continued)

*Primary Examiner* — Charles Garber
*Assistant Examiner* — Alia Sabur
(74) *Attorney, Agent, or Firm* — Shumaker & Sieffert, P.A.

(57) ABSTRACT

In one implementation, a semiconductor package includes an integrated circuit (IC) attached to a die paddle segment of a first patterned conduct carrier and coupled to a switch node segment of the first patterned conductive carrier by an electrical connector. In addition, the semiconductor package includes a second patterned conductive carrier situated over the IC, a magnetic material situated over the second patterned conductive carrier, and a third patterned conductive carrier situated over the magnetic material. The second patterned conductive carrier and the third patterned conductive carrier are electrically coupled so as to form windings of an integrated inductor in the semiconductor package.

22 Claims, 11 Drawing Sheets

(56) References Cited

U.S. PATENT DOCUMENTS

| | | | |
|---|---|---|---|
| 2002/0097129 A1 | 7/2002 | Johnson | |
| 2009/0134964 A1* | 5/2009 | Hebert | H01F 17/062 |
| | | | 336/200 |
| 2011/0298088 A1* | 12/2011 | Elian | H01F 17/0006 |
| | | | 257/531 |
| 2012/0181624 A1 | 7/2012 | Cho et al. | |
| 2012/0326287 A1* | 12/2012 | Joshi | H01L 23/49548 |
| | | | 257/676 |
| 2013/0043940 A1* | 2/2013 | Hebert | H01L 23/3732 |
| | | | 327/564 |
| 2013/0077250 A1* | 3/2013 | Herbsommer | H02M 3/00 |
| | | | 361/709 |
| 2013/0307117 A1 | 11/2013 | Koduri | |
| 2015/0001599 A1* | 1/2015 | Cho | H01L 23/3121 |
| | | | 257/288 |
| 2015/0200156 A1 | 7/2015 | Weld et al. | |

OTHER PUBLICATIONS

Office Action from U.S. Appl. No. 15/161,077, dated Mar. 9, 2017, 17 pp.
Response to Office Action dated Mar. 9, 2017, from U.S. Appl. No. 15/161,077, filed Apr. 28, 2017, 6 pp.
Final Office Action from U.S. Appl. No. 15/161,077 dated Jul. 27, 2017, 23 pages.

\* cited by examiner

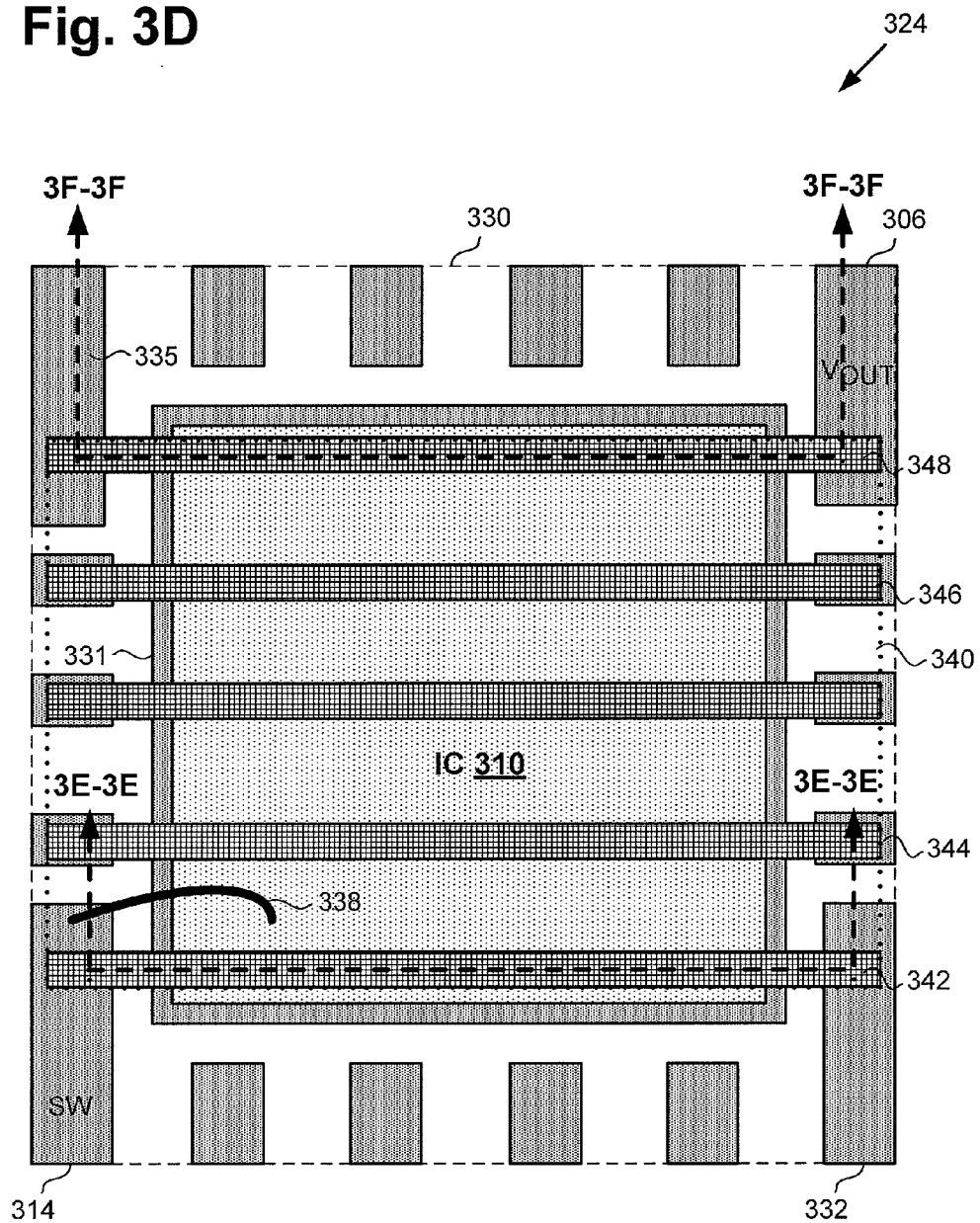

IC PACKAGE WITH INTEGRATED INDUCTOR

BACKGROUND

Integrated circuits (ICs) are widely utilized in modern electronic applications. For example, a power converter switching stage for use in a voltage regulator may be fabricated and packaged as an IC. Such a power converter switching stage IC typically includes a high side control transistor and a low side synchronous (sync) transistor, as well as driver circuitry designed to drive the control and sync transistors.

In many conventional implementations, a semiconductor package containing the power converter switching stage IC is utilized in combination with an output inductor of the power converter, which is often a relatively large discrete component. Consequently, conventional approaches to implementing a power converter on a printed circuit board (PCB) require PCB area sufficient to accommodate a side-by-side layout including not only the semiconductor package containing the power converter switching stage IC, but the output inductor for the power converter as well.

SUMMARY

The present disclosure is directed to an integrated circuit (IC) package with integrated inductor, substantially as shown in and/or described in connection with at least one of the figures, and as set forth in the claims.

BRIEF DESCRIPTION OF THE DRAWINGS

FIG. 3D shows a top view illustrating a result of performing a subsequent action according to the exemplary flowchart of FIG. 2, in accordance with one implementation.

DETAILED DESCRIPTION

Figure 1:
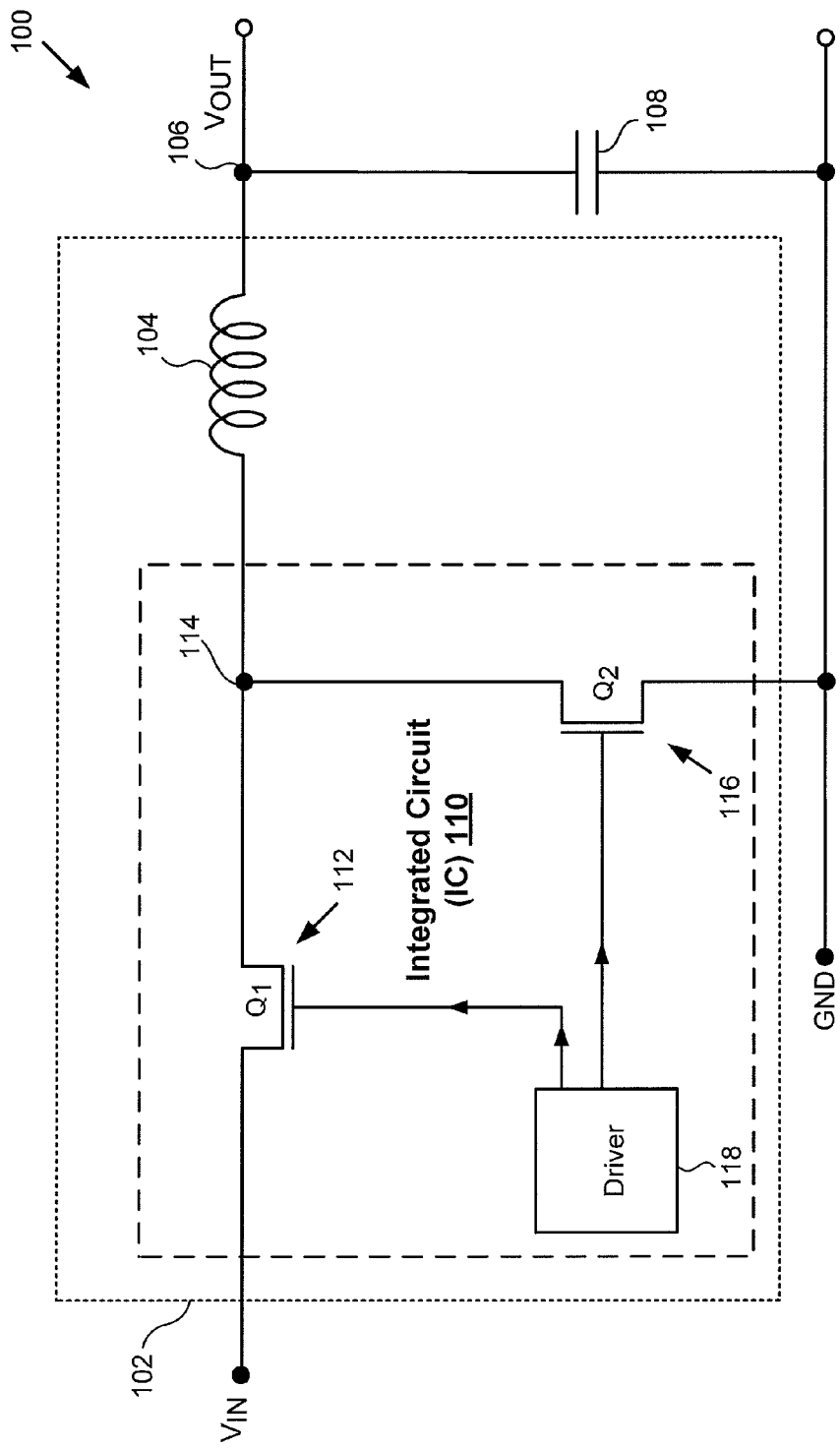
FIG. 1 shows a diagram of an exemplary power converter including an integrated circuit (IC) package with integrated inductor, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, integrated circuits (ICs) are widely utilized in modern electronic applications. For example, a power converter switching stage for use in a voltage regulator may be fabricated and packaged as an IC. Such a power converter switching stage IC typically includes a high side control transistor and a low side synchronous (sync) transistor, as well as driver circuitry designed to drive the control and sync transistors. As a specific example, a buck converter may include a switching stage IC to convert a higher voltage direct current (DC) input to a lower voltage DC output for use in low voltage applications.

FIG. 1 shows a diagram of a power converter including an exemplary switching stage IC in combination with an integrated output inductor of the power converter, according to one implementation. Power converter 100 includes semiconductor package 102 and output capacitor 108 coupled between output 106 of semiconductor package 102 and ground. As shown in FIG. 1, semiconductor package 102 includes IC 110, which is implemented as a monolithically integrated switching stage of power converter 100, and output inductor 104 of power converter 100 coupled between IC 110 and output 106 of semiconductor package 102. As further shown in FIG. 1, power converter 100 is configured to receive an input voltage $V_{IN}$, and to provide a converted voltage, e.g., a rectified and/or stepped down voltage, as $V_{OUT}$ at output 106.

It is noted that in the interests of ease and conciseness of description, the IC packaging solutions disclosed by the present application will in some instances be described by reference to specific implementations of a power converter, such as the buck converter implementation shown in FIG. 1. However, it is emphasized that such implementations are merely exemplary, and the inventive principles disclosed herein are broadly applicable to a wide range of applications, including not only buck and boost converters, but any application in which co-packaging of an IC and an integrated inductor would be advantageous or desirable.

According to the specific but non-limiting implementation shown in FIG. 1, IC 110 may include two power switches in the form of metal-oxide-semiconductor field-effect transistors (MOSFETs) configured as a half bridge, for example. That is to say, IC 110 may include high side or control FET 112 ($Q_1$) and low side or synchronous (sync) FET 116 ($Q_2$), as well as driver circuitry 118 for driving control FET 112 and sync FET 116. As further shown in FIG. 1, control FET 112 is coupled to sync FET 116 at switch node 114, which, in turn, is coupled to output 106 of semiconductor package 102 by output inductor 104 of power converter 100. As also shown in FIG. 1, output inductor 104 of power converter 100 is integrated into semiconductor package 102, such as by being vertically integrated with IC 110, as described in greater detail below.

Control FET 112 and sync FET 116 may be implemented as group IV based power FETs, such as silicon power MOSFETs having a vertical design, for example. However, it is noted that in some implementations, one or both of control FET 112 and sync FET 116 may take the form of other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium. Thus, in some implementations, one or both of control FET 112 and sync FET 116 may take the form of a III-Nitride power FET, such as a III-Nitride high electron mobility transistor (HEMT).

Figure 2:
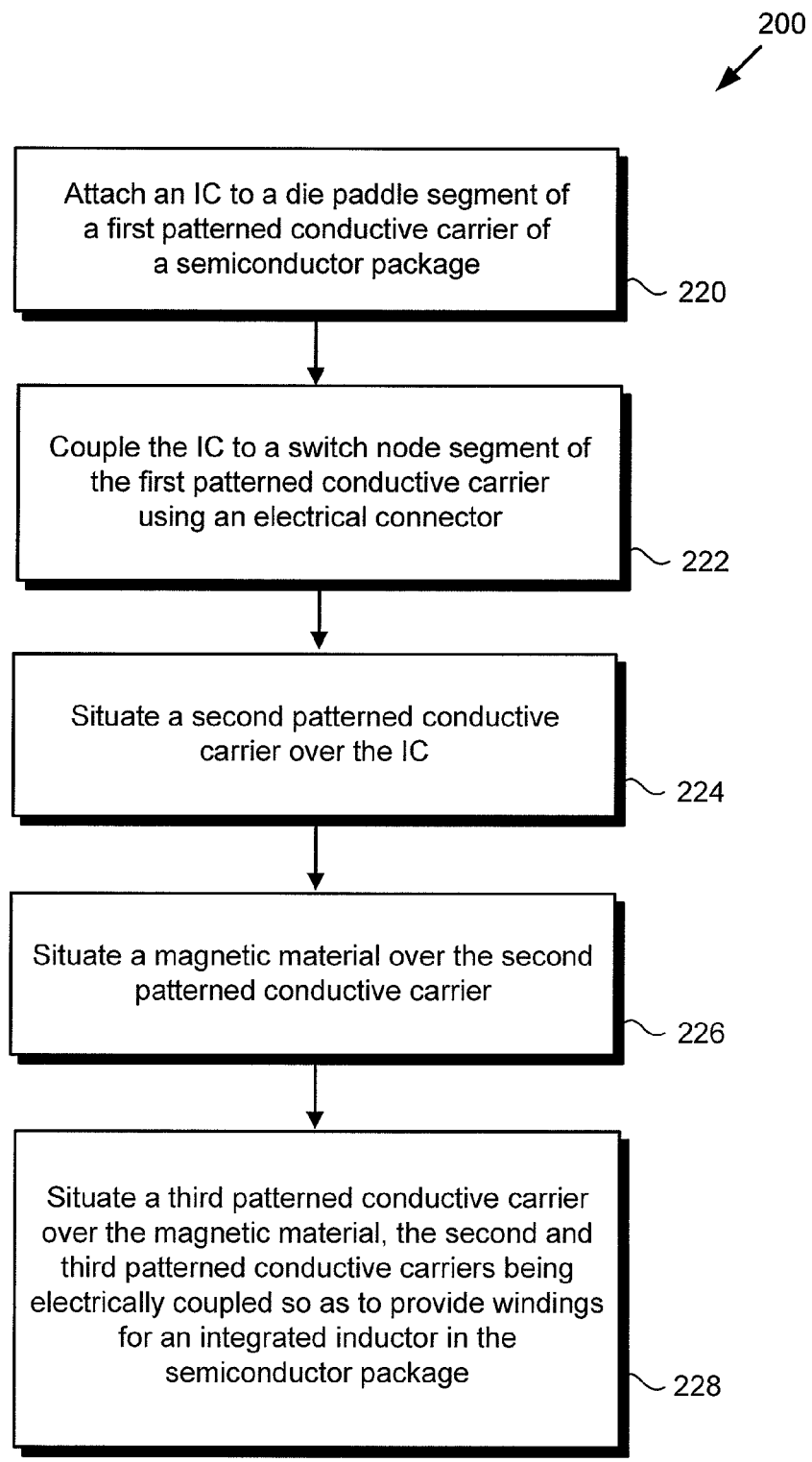
FIG. 2 shows a flowchart presenting an exemplary method for fabricating an IC package with vertically integrated inductor, according to one implementation.

Continuing to FIG. 2, FIG. 2 shows flowchart 200 presenting an exemplary method for fabricating an IC package with vertically integrated inductor. The exemplary method described by flowchart 200 is performed on a portion of a conductive carrier structure, which may be a semiconductor package lead frame, or may take the form of a conductive sheet or plate, for example.

Figure 3A:
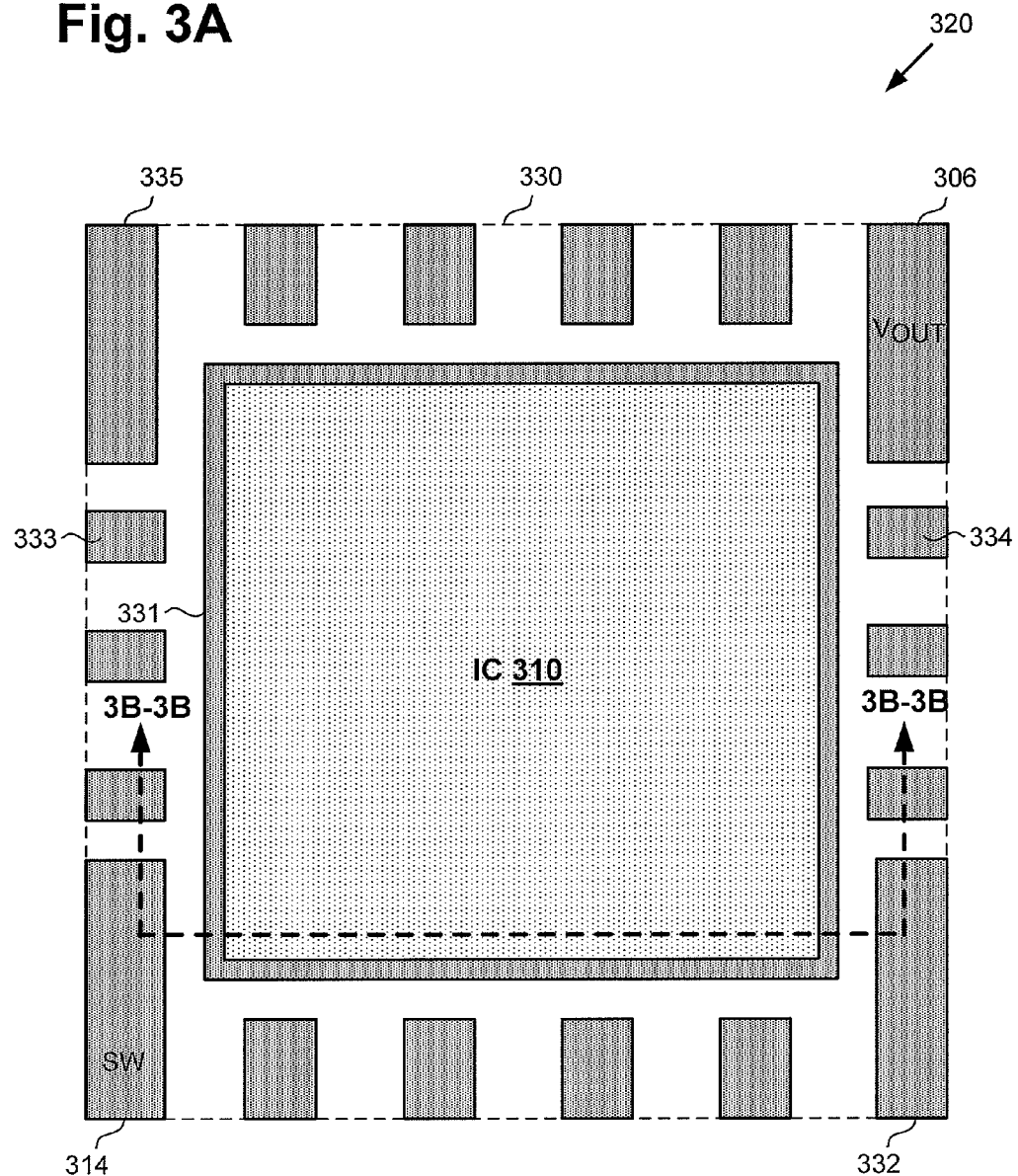
FIG. 3A shows a top view illustrating a result of performing an initial action according to the exemplary flowchart of FIG. 2, in accordance with one implementation.
Figure 3B:
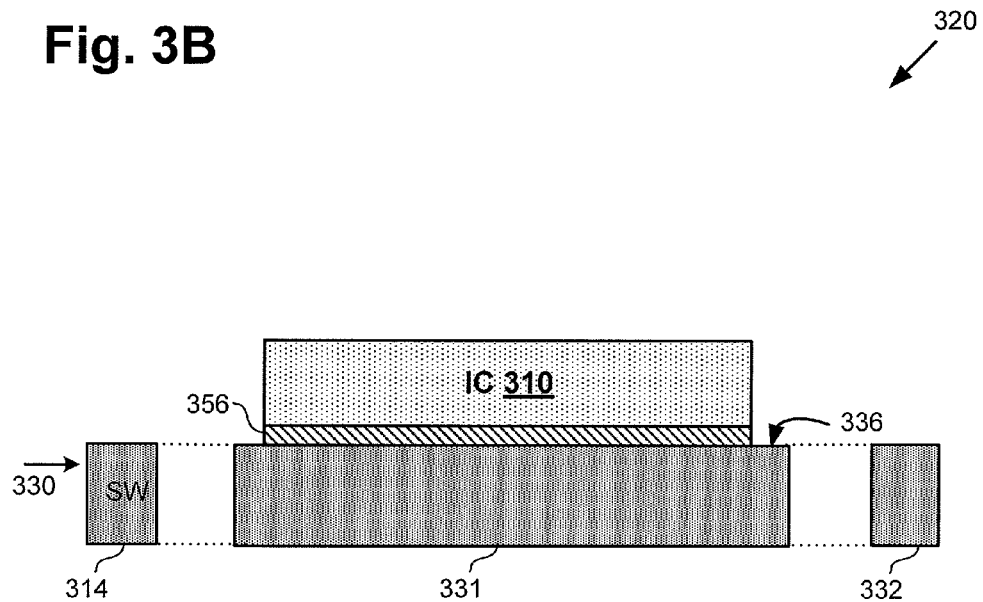
FIG. 3B shows a cross-sectional view of the structure shown in FIG. 3A, in accordance with one implementation.
Figure 3C:
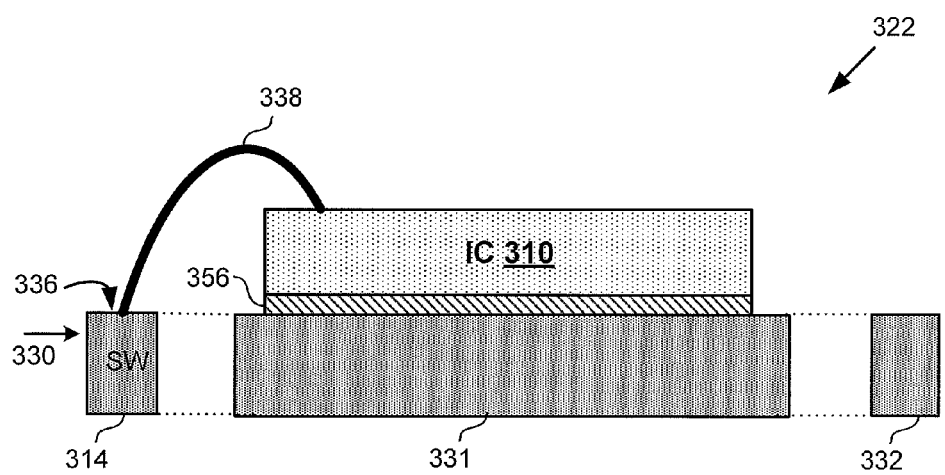
FIG. 3C shows a cross-sectional view illustrating a result of performing a subsequent action according to the exemplary flowchart of FIG. 2, in accordance with one implementation.
Figure 3E:
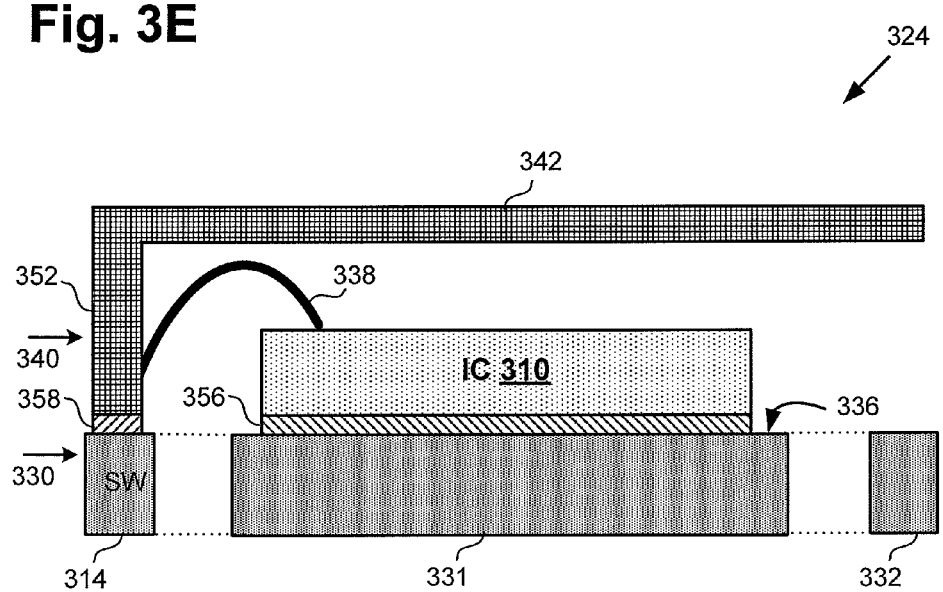
FIG. 3E shows a first cross-sectional view of the structure shown in FIG. 3D, in accordance with one implementation.
Figure 3F:
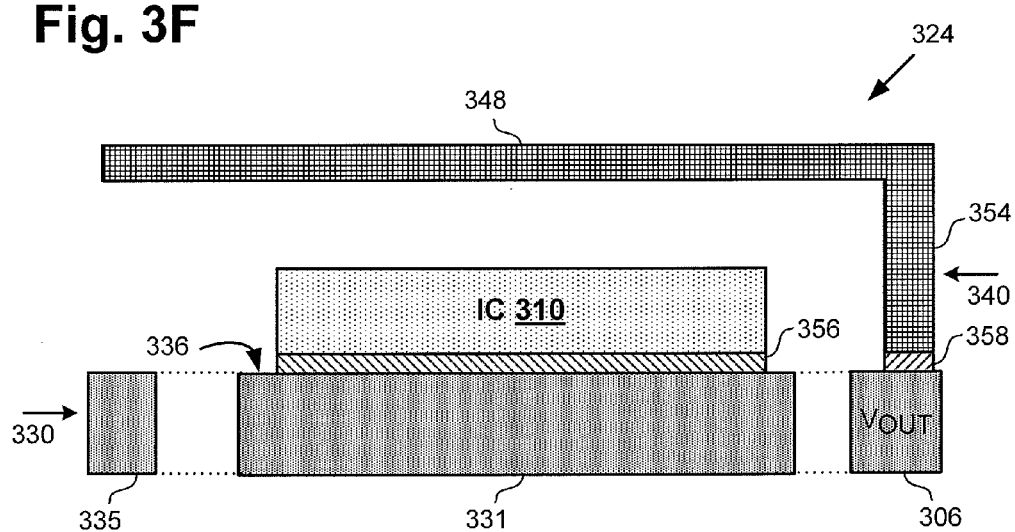
FIG. 3F shows a second cross-sectional view of the structure shown in FIG. 3D, in accordance with one implementation.

With respect to FIGS. 3A, 3B, 3C, 3D, 3E, 3F, 3G, 3H, 3I, and 3J (hereinafter "FIGS. 3A-3J"), structures 320, 322, 324, 326, and 328 shown in those figures illustrate the result of performing the method of flowchart 200, according to one implementation. For example, structure 320 in FIGS. 3A and 3B represents first patterned conductive carrier 330 having IC 310 attached thereto (action 220). Structure 322 in FIG. 3C shows IC 310 coupled to switch node segment 314 of first patterned conductive carrier by electrical connector 338 (action 222). Structure 324 in FIGS. 3D, 3E, and 3F shows second patterned conductive carrier 340 situated over IC 310 (action 224), and so forth.

Referring to flowchart 200, in FIG. 2, in combination with FIG. 1 and structure 320 in FIG. 3A, flowchart 200 begins with attaching IC 310 to die paddle segment 331 of first patterned conductive carrier 330 (action 220). First patterned conductive carrier 330 may be a fully patterned conductive carrier for use as part of semiconductor package 102, in FIG. 1. As shown in FIG. 3A, first patterned conductive carrier 330 has multiple segments including die paddle segment 331, switch node segment 314, output segment 306, and additional segments such as segments 332, 333, 334, and 335.

IC 310 and output segment 306 of first patterned conductive carrier 330 correspond respectively in general to IC 110 and output 106 of semiconductor package 102, in FIG. 1, and may share any of the characteristics attributed to those corresponding features in the present application. Thus, in one implementation, IC 310 may be a power converter switching stage IC including control FET 112, sync FET 116, switch node 114, and driver circuitry 118. Moreover, in such an implementation, switch node segment 314 of first patterned conductive carrier 330 may be electrically coupled to switch node 114 of IC 110/310, while output segment 306 of first patterned conductive carrier 330 may provide $V_{OUT}$ produced by power converter 100.

First patterned conductive carrier 330 may be formed of any conductive material having a suitably low electrical resistance. Examples of materials from which first patterned conductive carrier 330 may be formed include copper (Cu), aluminum (Al), or a conductive alloy. In one implementation, as noted above, first patterned conductive carrier 330 may be implemented using a portion of a semiconductor package lead frame.

Referring to FIG. 3B, FIG. 3B shows a cross-sectional view of structure 320 along perspective lines 3B-3B in FIG. 3A, according to one implementation. As shown in FIG. 3B, IC 310 is attached to die receiving side 336 of die paddle segment 331 of first patterned conductive carrier 330, using die attach material 356. Die attach material 356 may be any suitable adhesive material for attaching IC 310 to die receiving side 336 of die paddle segment 331.

It is noted that in various implementations, die attach material 356 may be an electrically insulating or an electrically conductive die attach material, formed to an exemplary thickness of approximately 10 µm or greater, for example. In implementations in which die attach material 356 is electrically conductive, die attach material 356 may be a conductive epoxy, solder, a conductive sintered material, or a diffusion bonded material, for instance.

Continuing to structure 322 in FIG. 3C with ongoing reference to FIG. 2, flowchart 200 continues with coupling IC 310 to switch node segment 314 of first patterned conductive carrier 310 using electrical connector 338 (action 222). As shown in FIG. 3C, IC 310 is coupled to die receiving side 336 of switch node segment 314 by electrical connector 338. As further shown by FIGS. 3A, 3B, and 3C, switch node segment 314 of first patterned conductive carrier 330 is electrically isolated from die paddle segment 331 to which IC 310 is attached.

It is noted that although electrical connector 338 is depicted as wire bond in FIG. 3C, that representation is merely for the purposes of conceptual clarity. More generally, electrical connector 338 may be implemented as wire bond, or as a conductive clip, ribbon, or strip, for example. It is further noted that in implementations in which IC 310 is a power converter switching stage IC, such as IC 110, in FIG. 1, electrical connector 338 electrically couples switch node 114 of IC 110/310 to switch node segment 314 of first patterned conductive carrier 330.

Moving to structure 324 in FIG. 3D with ongoing reference to FIG. 2, flowchart 200 continues with situating second patterned conductive carrier 340 over IC 310 (action 224). As shown in FIG. 3D, second patterned conductive carrier 340 includes multiple fingers, including fingers 342, 344, 346, and 348. Like first conductive carrier 330, second patterned conductive carrier 340 may be formed of any conductive material having a suitably low electrical resistance. Examples of materials from which second patterned conductive carrier 340 may be formed include Cu, Al, or a conductive alloy. In one implementation, second patterned conductive carrier 340 may be implemented using a portion of a semiconductor package lead frame.

Referring to FIG. 3E, FIG. 3E shows a cross-sectional view of structure 324 along perspective lines 3E-3E in FIG. 3D, according to one implementation. As shown in FIG. 3E, in addition to having multiple fingers, such as finger 342, second patterned conductive carrier 340 may include legs, such as first leg 352. First leg 352 may be a portion of second patterned conductive carrier 340 that is oriented substantially perpendicular to finger 342, for example. As further shown in FIG. 3D, first leg 352 of second patterned conductive carrier 340 adjoins finger 342 and is concurrently attached to switch node segment 314 of first patterned conductive carrier 330 by electrically conductive bonding material 358.

Electrically conductive bonding material 358 may be any suitable substance for use as an electrically conductive adhesive. For example, electrically conductive bonding material 358 may be a conductive epoxy, solder, a conductive sintered material, or a diffusion bonded material. Thus, first leg 352 and finger 342 of second patterned conductive carrier 340 are electrically coupled to switch node segment 314 of first patterned conductive carrier 330.

Moreover, reference to FIGS. 3D and 3E in combination reveals that electrical connector 338 makes contact with switch node segment 314 of first patterned conductive carrier 330 behind first leg 352 from the perspective shown in FIG. 3E. Consequently, according to the implementation shown in FIGS. 3D and 3E, first leg 352 and finger 342 of second patterned conductive carrier 340 are electrically coupled to switch node segment 314 of first patterned conductive carrier 330, while electrical connector 338 concurrently couples IC 310 to switch node segment 314.

Referring now to FIG. 3F, FIG. 3F shows a cross-sectional view of structure 324 along perspective lines 3F-3F in FIG. 3D, according to one implementation. As shown in FIG. 3F, like finger 342 in FIG. 3E, finger 348 of second patterned conductive carrier 340 is connected to a leg of second patterned conductive carrier 340, i.e., second leg 354. Moreover, and analogously to first leg 352, second leg 354 may be a portion of second patterned conductive carrier 340 that is oriented substantially perpendicular to finger 348. As further shown in FIG. 3F, in addition to being adjoined with finger 348, second leg 354 is attached to output segment 306 of first patterned conductive carrier by electrically conductive bonding material 358.

Thus, according to the implementation shown in FIGS. 3D, 3E, and 3F, second patterned conductive carrier 340 is situated over IC 310, includes multiple fingers, such as fingers 342, 344, 346, and 348, and includes first and second legs 352 and 354. In addition, second patterned conductive carrier 340 is electrically coupled to switch node segment 314 of first patterned conductive carrier 330 by first leg 352 and electrically conductive bonding material 358. Second patterned conductive carrier 340 is further electrically coupled to output segment 306 of first patterned conductive carrier 330 by second leg 354 of second patterned conductive carrier 340 and electrically conductive bonding material 358.

It is noted that, according to the implementation shown in FIGS. 3D, 3E, and 3F, only fingers 342 and 348 of second patterned conductive carrier 340 are adjoined by legs, i.e., respective first and second legs 352 and 354, that are electrically coupled to first patterned conductive carrier 330. That is to say, neither finger 344 nor finger 346, or any other finger of second patterned conductive carrier 340 other than finger 342 and finger 348 is adjoined by a leg electrically coupled to first conductive carrier 330.

Figure 3G:
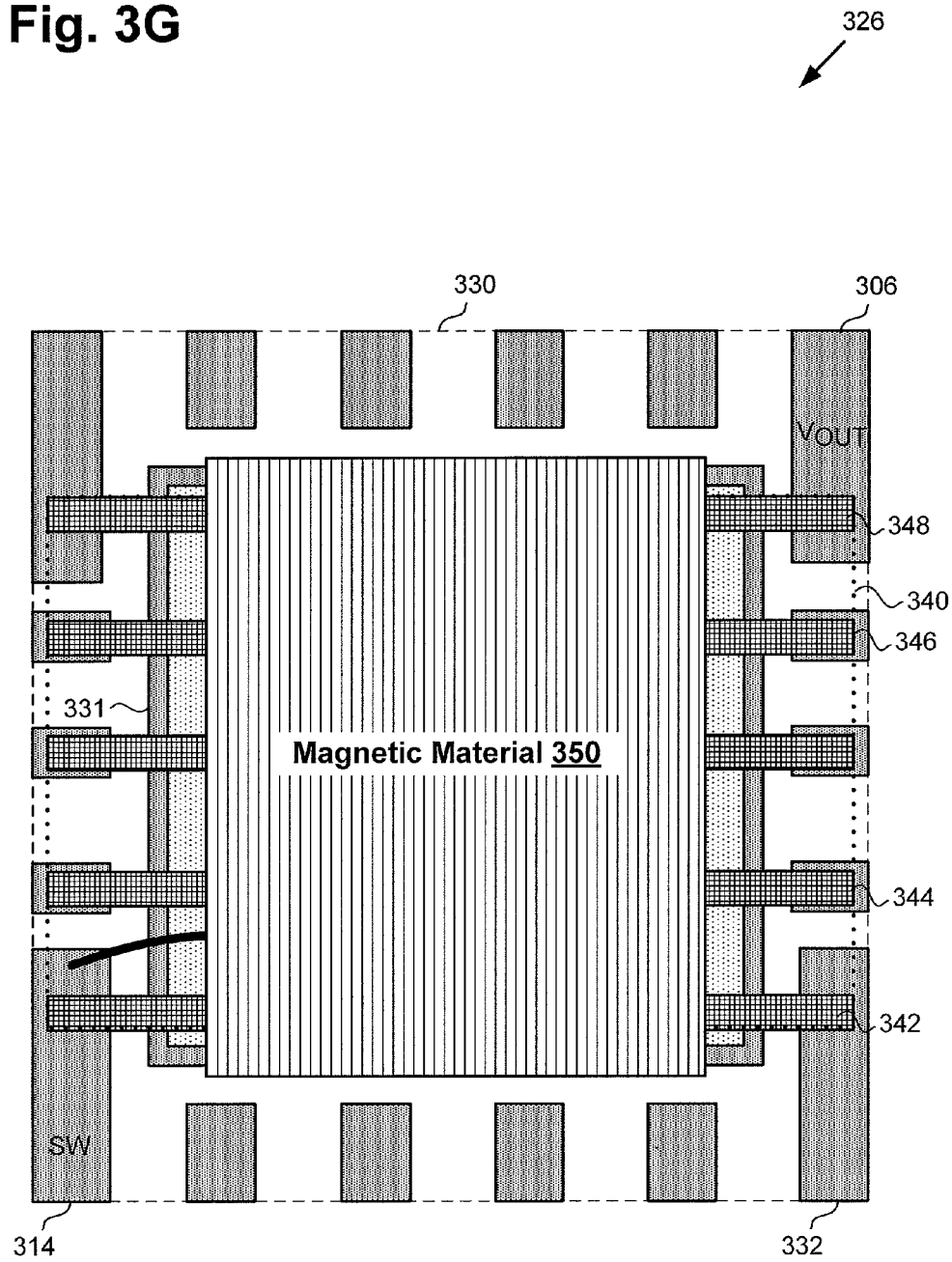
FIG. 3G shows a top view illustrating a result of performing a subsequent action according to the exemplary flowchart of FIG. 2, in accordance with one implementation.

Moving to structure 326 in FIG. 3G with further reference to FIG. 2, flowchart 200 continues with situating magnetic material 350 over second patterned conductive carrier 340 (action 226). Magnetic material 350 may be any material suitable for use as an inductor core. For example, magnetic material 350 may take the form of a magnetic core, such as a high stability ferrite core of output inductor 104, in FIG. 1.

Figure 3H:
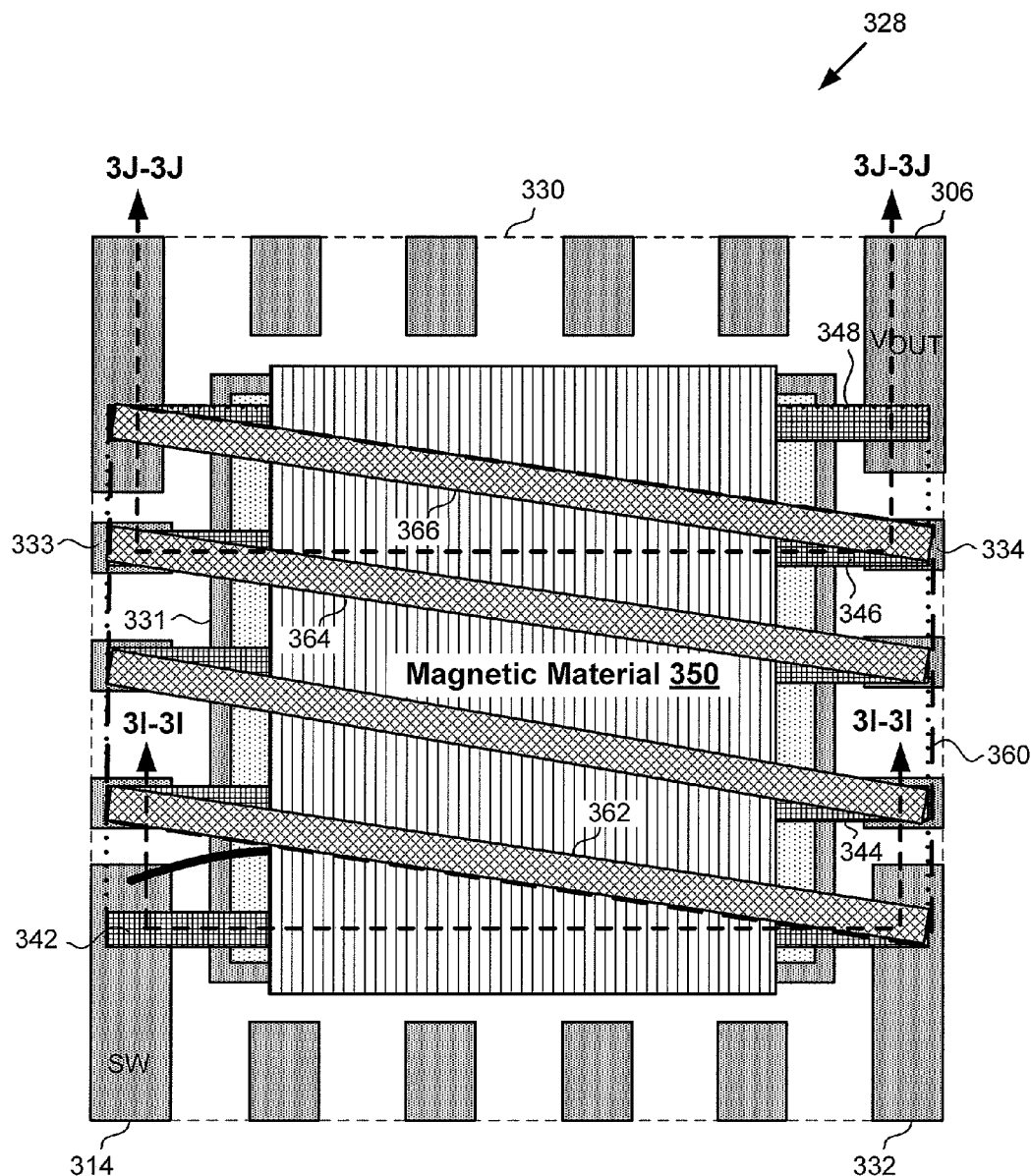
FIG. 3H shows a top view illustrating a result of performing a final action according to the exemplary flowchart of FIG. 2, in accordance with one implementation.

Continuing to structure 328 in FIG. 3H, flowchart 200 can conclude with situating third patterned conductive carrier 360 over magnetic material 350 (action 228). As shown in FIG. 3H, third patterned conductive carrier 360 may be a fully patterned conductive carrier having multiple oblique fingers including oblique fingers 362, 364, and 366.

Like first patterned conductive carrier 330 and second patterned conductive carrier 340, third patterned conductive carrier 360 may be formed of any conductive material having a suitably low electrical resistance. Examples of materials from which third patterned conductive carrier 360 may be formed include Cu, aluminum Al, or a conductive alloy. In one implementation, third patterned conductive carrier 360 may be implemented using a portion of a semiconductor package lead frame. In other words, in various implementations, any, all, or any combination of first patterned conductive carrier 330, second patterned conductive carrier 340, and third patterned conductive carrier 360 may be implemented using respective semiconductor package lead frames.

Figure 3I:
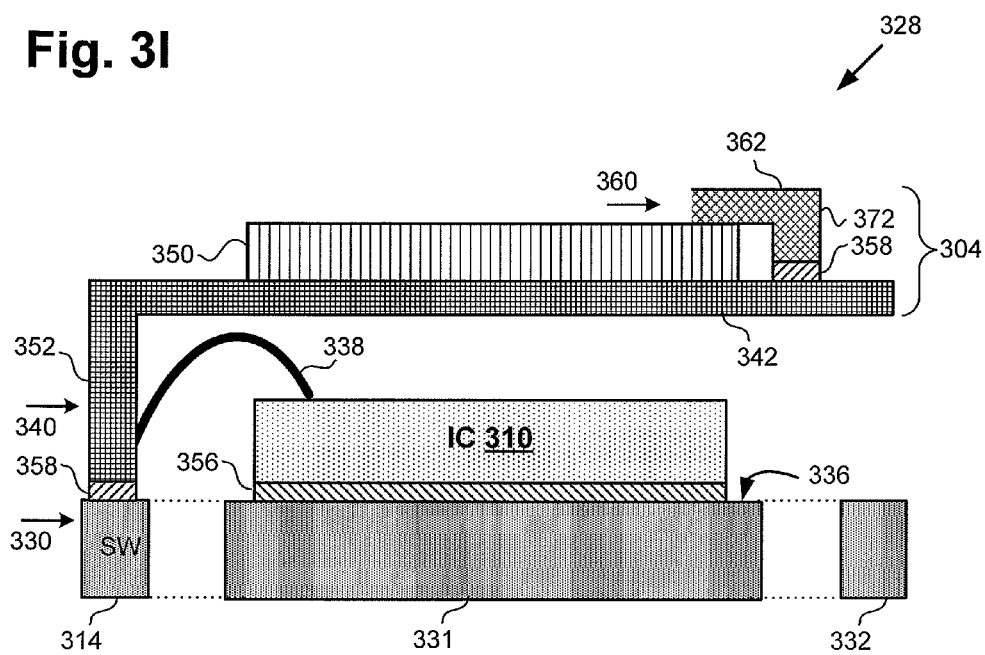
FIG. 3I shows a first cross-sectional view of the structure shown in FIG. 3H, in accordance with one implementation.

Referring to FIG. 3I, FIG. 3I shows a cross-sectional view of structure 328 along perspective lines 3I-3I in FIG. 3H, according to one implementation. As shown in FIG. 3I, in addition to having multiple oblique fingers, such as oblique finger 362, third patterned conductive carrier 360 also includes multiple legs, such as leg 372. Leg 372 may be a portion of third patterned conductive carrier 360 that is oriented substantially perpendicular to oblique finger 362. It is noted that oblique finger 362 is only partially shown in FIG. 3I because oblique finger 362 would be only partially visible from the perspective corresponding to perspective lines 3I-3I in FIG. 3H.

As further shown in FIG. 3I, leg 372 of third patterned conductive carrier 360 adjoins oblique finger 362 and is concurrently attached to finger 342 of second patterned conductive carrier 340 by electrically conductive bonding material 358. Thus, according to the implementation shown in FIG. 3I, leg 372 and oblique finger 362 of third patterned conductive carrier 360 are electrically coupled to second patterned conductive carrier 340.

As a result, and as described in greater detail below, second patterned conductive carrier 340 and third patterned conductive carrier 360 are electrically coupled so as to provide windings for vertically integrated inductor 304. Inductor 304 corresponds in general to output inductor 104, in FIG. 1, and may share any of the characteristics attributed to that corresponding feature in the present application. That is to say, in one implementation, inductor 304 may be an output inductor of a power converter, such as power converter 100, in FIG. 1.

Figure 3J:
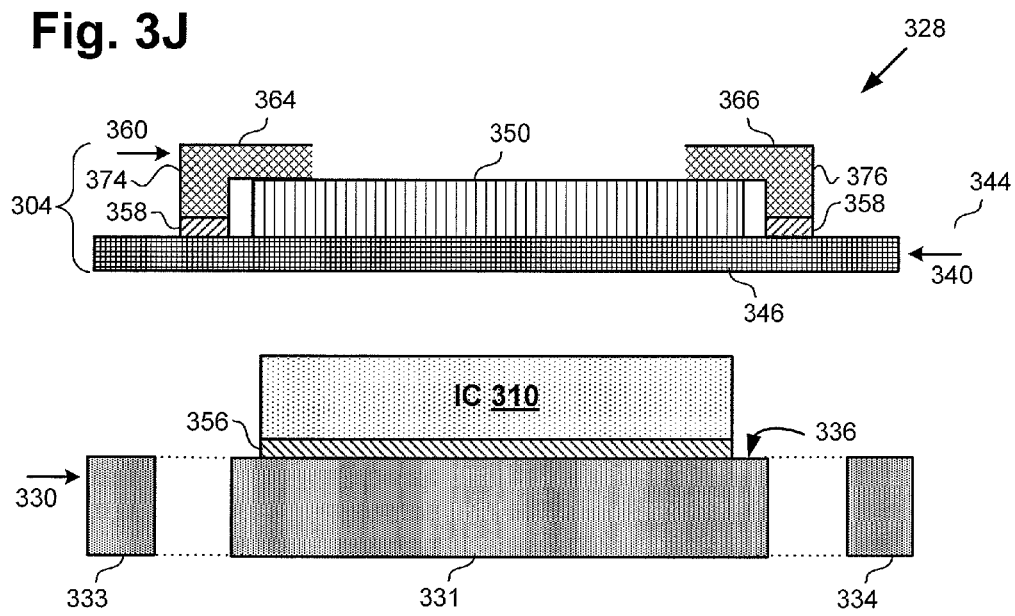
FIG. 3J shows a second cross-sectional view of the structure shown in FIG. 3H, in accordance with one implementation.

Referring now to FIG. 3J, FIG. 3J shows a cross-sectional view of structure 324 along perspective lines 3J-3J in FIG. 3H, according to one implementation. As shown in FIG. 3J, each of oblique finger 364 and oblique finger 366 of third patterned conductive carrier 360 partially overlies finger 346 of second patterned conductive carrier 340. Like oblique finger 362, each of oblique fingers 364 and 366 of third patterned conductive carrier 360 is connected to two legs of third patterned conductive carrier 360. For example, reference to FIGS. 3H and 3J in combination discloses that oblique finger 366 of third patterned conductive carrier 360 is electrically coupled to finger 346 of second patterned conductive carrier 340 by leg 376 of third patterned conductive carrier 360 and electrically conductive bonding material 358. Oblique finger 366 is further electrically coupled to finger 348, which neighbors finger 346, by another leg 376 (not visible in FIG. 3J) and electrically conductive bonding material 358.

Analogously, reference to FIGS. 3H and 3J in combination discloses that oblique finger 364 of third patterned conductive carrier 360 is electrically coupled to finger 346 of second patterned conductive carrier 340 by leg 374 of third patterned conductive carrier 360 and electrically conductive bonding material 358. Oblique finger 364 is further electrically coupled to a finger of second patterned conductive carrier 340 situated between and neighboring each of fingers 344 and 346 by another leg 374 (not visible in FIG. 3J) and electrically conductive bonding material 358. Legs 374 and 376 may be portions of third patterned conductive carrier 360 that are oriented substantially perpendicular to and adjoin respective oblique fingers 364 and 366.

Thus, according to the implementation shown in FIGS. 3H, 3I, and 3J, each oblique finger of third conductive carrier 360 is coupled to and forms an electrically conductive bridge between neighboring fingers of second patterned conductive carrier 360. As a result, the fingers of second patterned conductive carrier 340 and the oblique fingers of third patterned conductive carrier 360 are electrically coupled to form a continuous winding of output inductor 304 that surrounds magnetic material 350 from finger 342 to finger 348. Consequently, second patterned conductive carrier 340 and third patterned conductive carrier 360 are coupled between switch node segment 314 of first patterned conductive carrier 330 and output segment 306 of first patterned conductive carrier 330.

Figure 4:
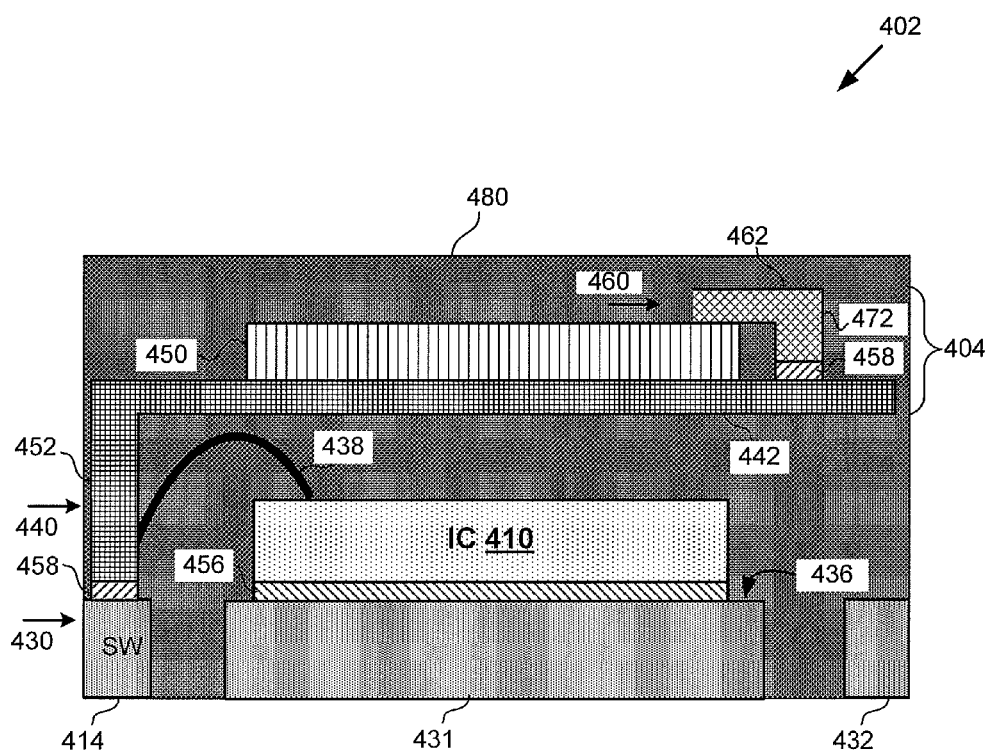
FIG. 4 shows a cross-sectional view of an IC package with vertically integrated inductor, according to one implementation.

Moving to FIG. 4, FIG. 4 shows a cross-sectional view of semiconductor package 402 including IC 410 and vertically integrated inductor 404, according to one implementation. It is noted that semiconductor package 402 corresponds in general to semiconductor package 102, in FIG. 1, and may share any of the characteristics attributed to that corresponding feature in the present application. It is further noted that the features shown to be contained by semiconductor package 402 correspond in general to structure 328, in FIGS. 3H, 3I, and 3J viewed from a perspective corresponding to perspective lines 3I-3I, in FIG. 3H.

Semiconductor package 402 includes IC 410 attached to die receiving side 436 of die paddle segment 431 of first patterned conductive carrier 430 by die attach material 456. In addition, first patterned conductive carrier 430 of semiconductor package 402 includes segment 432, and switch node segment 414 coupled to IC 410 by electrical connector 438. As shown in FIG. 4, semiconductor package 402 also includes second patterned conductive carrier 440 having finger 442 and leg 452, situated over IC 410, and magnetic material 450 situated over second patterned conductive carrier 440. As further shown in FIG. 4, semiconductor package 402 includes third patterned conductive carrier 460 having oblique finger 462 and leg 472, situated over magnetic material 450. Also shown in FIG. 4 are electrically conductive bonding material 458 and packaging encapsulant 480.

IC 410, die attach material 456, electrical connector 438, and first patterned conductive carrier 430 correspond respectively in general to IC 310, die attach material 356, electrical connector 338, and first patterned conductive carrier 330, in FIGS. 3A-3J, and may share any of the characteristics attributed to those corresponding features, above. In addition to corresponding to IC 310, IC 410 also corresponds in general to IC 110, in FIG. 1, and may share any of the characteristics attributed to that corresponding feature, above. That is to say, in one implementation, IC 410 may be a switching stage IC for use in power converter 100.

Second patterned conductive carrier 440, magnetic material 450, third patterned conductive carrier 460, and electrically conductive bonding material 458 correspond respectively in general to second patterned conductive carrier 340, magnetic material 350, third patterned conductive carrier 360, and electrically conductive bonding material 358, and may share any of the characteristics attributed to those corresponding features, above. It is noted that packaging encapsulant 480 may be any suitable dielectric molding compound or encapsulation material typically used in semiconductor packaging.

It is noted that, analogously to the implementation shown by FIGS. 3D and 3E, electrical connector 438, in FIG. 4, makes contact with switch node segment 414 of first patterned conductive carrier 430 behind leg 452 of second patterned conductive carrier 440 from the perspective shown in FIG. 4. Consequently, according to the implementation shown in FIG. 4, leg 452 and finger 442 of second patterned conductive carrier 440 are electrically coupled to switch node segment 414 of first patterned conductive carrier 430, while electrical connector 438 concurrently couples IC 410 to switch node segment 414.

As discussed above by reference to FIGS. 3H, 3I, and 3J, the fingers of second patterned conductive carrier 440 and the oblique fingers of third patterned conductive carrier 460 are electrically coupled to form a continuous winding of output inductor 404 that surrounds magnetic material 450 from a finger of second patterned conductive carrier 440 corresponding to finger 342 in FIG. 3H, to a finger of second patterned conductive carrier 440 corresponding to finger 348 in FIG. 3H. Consequently, second patterned conductive carrier 440 and third patterned conductive carrier 460 are coupled between switch node segment 414 of first patterned conductive carrier 430 and an output segment of first patterned conductive carrier 430 corresponding to output segment 306 in FIG. 3H. As a result, output inductor 404 is vertically integrated into semiconductor package 402 by having magnetic material 450 providing the magnetic core of output inductor 404 surrounded by inductor windings provided by second patterned conductive carrier 440 and third patterned conductive carrier 460.

Figure 5:
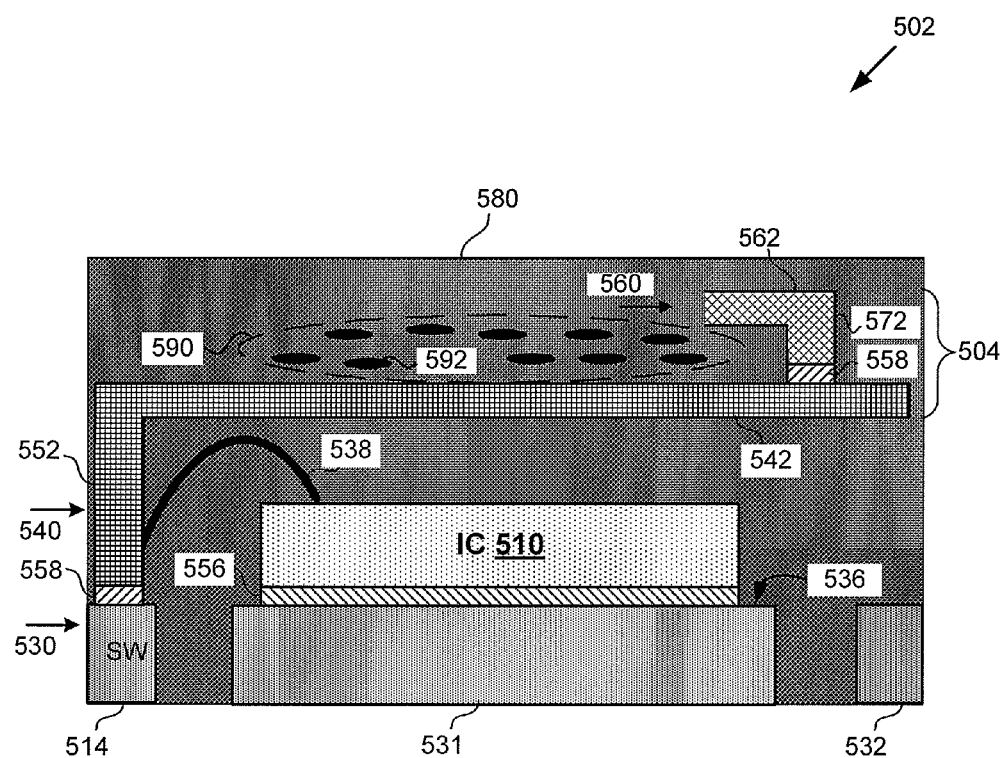
FIG. 5 shows a cross-sectional view of an IC package with vertically integrated inductor, according to another implementation.

Continuing to FIG. 5, FIG. 5 shows a cross-sectional view of semiconductor package 502 including IC 510 and vertically integrated inductor 504, according to another implementation. It is noted that semiconductor package 502 corresponds in general to semiconductor package 102/402, in FIG. 1/4, and may share any of the characteristics attributed to that corresponding feature in the present application. It is further noted that, with the exception of magnetic material 590, the features shown to be contained by semiconductor package 502 correspond in general to structure 328, in FIGS. 3H, 3I, and 3J viewed from a perspective corresponding to perspective lines 3I-3I, in FIG. 3H.

Semiconductor package 502 includes IC 510 attached to die receiving side 536 of die paddle segment 531 of first patterned conductive carrier 530 by die attach material 556. In addition, first patterned conductive carrier 530 of semiconductor package 502 includes segment 532, and switch node segment 514 coupled to IC 510 by electrical connector 538. As shown in FIG. 5, semiconductor package 502 also includes second patterned conductive carrier 540 having finger 542 and leg 552, situated over IC 510, and magnetic material 550 situated over second patterned conductive carrier 540. As further shown in FIG. 5, semiconductor package 502 includes third patterned conductive carrier 560 having oblique finger 562 and leg 572, situated over magnetic material 550. Also shown in FIG. 5 are magnetic material 590 including magnetic particles 592, electrically conductive bonding material 558, and packaging encapsulant 580.

IC 510, die attach material 556, electrical connector 538, and first patterned conductive carrier 530 correspond respectively in general to IC 310, die attach material 356, electrical connector 338, and first patterned conductive carrier 330, in FIGS. 3A-3J, and may share any of the characteristics attributed to those corresponding features, above. In addition to corresponding to IC 310, IC 510 also corresponds in general to IC 110, in FIG. 1, and may share any of the characteristics attributed to that corresponding feature, above. That is to say, in one implementation, IC 510 may be a switching stage IC for use in power converter 100.

Second patterned conductive carrier 540, third patterned conductive carrier 560, and electrically conductive bonding material 558 correspond respectively in general to second patterned conductive carrier 340, third patterned conductive carrier 360, and electrically conductive bonding material 358, and may share any of the characteristics attributed to those corresponding features, above. It is noted that packaging encapsulant 580 may be any suitable dielectric molding compound or encapsulation material typically used in semiconductor packaging.

It is further noted that, analogously to the implementation shown by FIGS. 3D and 3E, electrical connector 538, in FIG. 5, makes contact with switch node segment 514 of first patterned conductive carrier 530 behind leg 552 of second patterned conductive carrier 540 from the perspective shown in FIG. 5. Consequently, according to the implementation shown in FIG. 5, leg 552 and finger 542 of second patterned conductive carrier 540 are electrically coupled to switch node segment 514 of first patterned conductive carrier 530, while electrical connector 538 concurrently couples IC 510 to switch node segment 514.

Semiconductor package 502 differs from semiconductor package 402 in that according to the present implementation, magnetic material 590 of output inductor 504 is provided by packaging encapsulant 580, which may be a molding compound impregnated with magnetic particles 592, for example. Magnetic particles 592 may be ferrite particles, for instance, which may be dispersed in packaging encapsulant 580 between finger 542 of second patterned conductive carrier 540 and oblique finger 562 of third patterned conductive carrier 560, as well as between all other fingers of second patterned conductive carrier 540 and oblique fingers of third patterned conductive carrier 560 providing windings of output inductor 504.

As discussed above by reference to FIGS. 3H, 3I, and 3J, the fingers of second patterned conductive carrier 540 and the oblique fingers of third patterned conductive carrier 560 are electrically coupled to form a continuous winding of output inductor 504 that surrounds magnetic material 590 from a finger of second patterned conductive carrier 540 corresponding to finger 342 in FIG. 3H, to a finger of second patterned conductive carrier 540 corresponding to finger 348 in FIG. 3H. Consequently, second patterned conductive carrier 540 and third patterned conductive carrier 560 are coupled between switch node segment 514 of first patterned conductive carrier 530 and an output segment of first patterned conductive carrier 530 corresponding to output segment 306 in FIG. 3H. As a result, output inductor 504 is vertically integrated into semiconductor package 502 by having magnetic material 590 of output inductor 504 surrounded by inductor windings provided by second patterned conductive carrier 540 and third patterned conductive carrier 560.

Thus, the present application discloses an IC package with vertically integrated inductor that provides a highly compact design. In one implementation, for example, the disclosed semiconductor package may provide packaging for a power converter switching stage IC suitable for use as a voltage regulator. By coupling fingers of a second patterned conductive carrier situated over an IC attached to a first patterned conductive carrier, to oblique fingers of a third patterned conductive carrier, the implementations disclosed herein enable use of the second and third patterned conductive carriers to provide windings of an output inductor having its magnetic core situated between the second and third patterned conductive carriers. Consequently, the packaging solutions disclosed herein advantageously result in a substantial reduction in the printed circuit board surface area required to implement an IC in combination with an inductor.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
an integrated circuit (IC) attached to a die paddle segment of a first patterned conduct carrier;
said IC coupled to a switch node segment of said first patterned conductive carrier by an electrical connector;
a second patterned conductive carrier situated over said IC;
a magnetic material situated over said second patterned conductive carrier;
a third patterned conductive carrier situated over said magnetic material;
said second patterned conductive carrier and said third patterned conductive carrier being mechanically coupled at ends external said magnetic material so as to form a continuous coil of an integrated inductor in said semiconductor package that is wound fully around said magnetic material.

2. The semiconductor package of claim 1, wherein said magnetic material comprises a magnetic core.

3. The semiconductor package of claim 1, wherein said magnetic material comprises a molding compound impregnated with magnetic particles.

4. The semiconductor package of claim 1, wherein said electrical connector is selected from the group consisting of a wire bond, a conductive clip, a conductive ribbon, and a conductive strip.

5. The semiconductor package of claim 1, wherein said IC comprises a power converter switching stage, said integrated inductor being implemented as an output inductor of said power converter switching stage.

6. The semiconductor package of claim 5, wherein said second patterned conductive carrier and said third patterned conductive carrier are coupled between said switch node segment and a power converter output segment of said first patterned conductive carrier.

7. The semiconductor package of claim 5, wherein said power converter switching stage includes a control transistor coupled to a sync transistor at said switch node, and wherein said control and sync transistors comprise silicon transistors.

8. The semiconductor package of claim 5, wherein said power converter switching stage includes a control transistor coupled to a sync transistor at said switch node, and wherein said control and sync transistors comprise group III-V transistors.

9. The semiconductor package of claim 1, wherein at least one of said second patterned conductive carrier and said third patterned conductive carrier comprises a portion of a lead frame.

10. The semiconductor package of claim 1, wherein said third patterned conductive carrier comprises a portion of a lead frame.

11. A method for fabricating a semiconductor package, said method comprising:
- attaching an integrated circuit (IC) to a die paddle segment of a first patterned conductive carrier;
- coupling said IC to a switch node segment of said first patterned conductive carrier using an electrical connector;
- situating a second patterned conductive carrier over said IC;
- situating a magnetic material over said second patterned conductive carrier;
- situating a third patterned conductive carrier over said magnetic material;
- said second patterned conductive carrier and said third patterned conductive carrier being mechanically coupled at ends external said magnetic material so as to form a continuous coil of an integrated inductor in said semiconductor package that is wound fully around said magnetic material.

12. The method of claim 11, wherein said magnetic material comprises a magnetic core.

13. The method of claim 11, wherein said magnetic material comprises a molding compound impregnated with magnetic particles.

14. The method of claim 11, wherein said electrical connector is selected from the group consisting of a wire bond, a conductive clip, a conductive ribbon, and a conductive strip.

15. The method of claim 11, wherein said IC comprises a power converter switching stage, said integrated inductor being implemented as an output inductor of said power converter switching stage.

16. The method of claim 15, wherein said second patterned conductive carrier and said third patterned conductive carrier are coupled between said switch node segment and a power converter output segment of said first patterned conductive carrier.

17. The method of claim 15, wherein said power converter switching stage includes a control transistor coupled to a sync transistor at said switch node, and wherein said control and sync transistors comprise silicon transistors.

18. The method of claim 15, wherein said power converter switching stage includes a control transistor coupled to a sync transistor at said switch node, and wherein said control and sync transistors comprise group III-V transistors.

19. The method of claim 11, wherein at least one of said second patterned conductive carrier and said third patterned conductive carrier comprises a portion of a lead frame.

20. The method of claim 11, wherein said third patterned conductive carrier comprises a portion of a lead frame.

21. The semiconductor package of claim 1, wherein said third patterned conductive carrier extends across said semiconductor package from a first end towards a second opposite end at a non-right angle with respect to said second patterned conductive carrier.

22. The method of claim 11, further comprising mechanically coupling said second patterned conductive carrier and said third patterned conductive carrier at ends external said magnetic material so as to form the continuous coil of the integrated inductor in said semiconductor package that is wound fully around said magnetic material.

* * * * *